United States Patent
Yamamoto et al.

(10) Patent No.: US 10,181,250 B2
(45) Date of Patent: Jan. 15, 2019

(54) BOARD WORK DEVICE AND BOARD WORK SYSTEM

(71) Applicant: FUJI CORPORATION, Chiryu (JP)

(72) Inventors: Mizuho Yamamoto, Okazaki (JP); Shingo Fujimura, Toyoake (JP); Junro Takakuwa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/507,965

(22) PCT Filed: Sep. 12, 2014

(86) PCT No.: PCT/JP2014/074201
§ 371 (c)(1),
(2) Date: Mar. 1, 2017

(87) PCT Pub. No.: WO2016/038730
PCT Pub. Date: Mar. 17, 2016

(65) Prior Publication Data
US 2017/0287310 A1 Oct. 5, 2017

(51) Int. Cl.
*G08B 21/18* (2006.01)
*G08B 5/22* (2006.01)
(Continued)

(52) U.S. Cl.
CPC ......... *G08B 21/185* (2013.01); *G05B 19/418* (2013.01); *G07C 3/08* (2013.01);
(Continued)

(58) Field of Classification Search
None
See application file for complete search history.

(56) References Cited

U.S. PATENT DOCUMENTS 6,594,887 B1    7/2003  Okuda et al.
7,640,369 B2 *  12/2009  Inada ................... G06F 9/4411
                                                            710/17
(Continued)

FOREIGN PATENT DOCUMENTS

CN    2031126 U  *  1/1989
EP    1 054 584 A1    11/2000
(Continued)

OTHER PUBLICATIONS

Extended European Search Report dated Jan. 2, 2018 in Patent Application No. 14901706.3, citing documents AA-AC, AO-AR, therein, 13 pages.

(Continued)

*Primary Examiner* — Chico A Foxx
(74) *Attorney, Agent, or Firm* — Oblon, McClelland, Maier & Neustadt, L.L.P.

(57) ABSTRACT

In a board work system, the CPU of a board work device transmits error related information which relates to an error in a case where the error has occurred in the own device. Then, the CPU receives the error related information which relates to the error of the other board work device, and stores the received error related information in the HDD. Then, the display operation section is controlled such that information (other device error notification screen) based on the stored error related information is notified to the operator in a case where the power source of the board work device (other board work device), in which the error has occurred, is detected to be switched off.

15 Claims, 6 Drawing Sheets

(51) Int. Cl.
*G07C 3/08* (2006.01)
*H05K 13/08* (2006.01)
*H05K 13/04* (2006.01)
*G05B 19/418* (2006.01)

(52) U.S. Cl.
CPC ............... *G08B 5/22* (2013.01); *H05K 13/04* (2013.01); *H05K 13/08* (2013.01); *Y02P 90/02* (2015.11)

(56) References Cited

U.S. PATENT DOCUMENTS

| | | | | |
|---|---|---|---|---|
| 8,386,063 | B2* | 2/2013 | Ogata | H05K 13/08 414/222.01 |
| 9,204,586 | B2* | 12/2015 | Kato | H05K 13/0452 |
| 2002/0166225 | A1 | 11/2002 | Kodama | |
| 2008/0078834 | A1* | 4/2008 | Woodward | H05K 13/08 235/385 |
| 2008/0221726 | A1 | 9/2008 | Rotzler et al. | |
| 2016/0360657 | A1* | 12/2016 | Oyama | H05K 13/0434 |

FOREIGN PATENT DOCUMENTS

| | | | | |
|---|---|---|---|---|
| EP | 1 898 280 A1 | | 3/2008 | |
| EP | 2 291 068 A2 | | 3/2011 | |
| JP | 2005-208891 A | | 8/2005 | |
| JP | 2007336174 A | * | 12/2007 | ............... H04B 3/54 |
| JP | 2008027953 A | * | 2/2008 | |
| JP | 2010-146454 A | | 7/2010 | |
| JP | 2010-263068 A | | 11/2010 | |
| JP | 4865435 B2 | | 2/2012 | |
| JP | 2012-256134 A | | 12/2012 | |
| JP | 2012248577 A | * | 12/2012 | |
| JP | 5186055 B2 | | 4/2013 | |
| JP | WO 2016117085 A1 | * | 7/2016 | ............. H05K 13/04 |
| WO | WO 2009/060705 A1 | | 5/2009 | |
| WO | WO 2013/088787 A1 | | 6/2013 | |

OTHER PUBLICATIONS

International Search Report dated Dec. 9, 2014, in PCT/JP2014/074201 filed Sep. 12, 2014.
Japanese Office Action dated Aug. 1, 2018 in Japanese Patent Application No. 2016-547329 (with English translation), 6 pages.

* cited by examiner

BOARD WORK DEVICE AND BOARD WORK SYSTEM

TECHNICAL FIELD

The present application relates to a board work device and a board work system.

BACKGROUND ART

In the related art, a board work device such as amounting device that mounts a component on aboard is known. For example, PTL 1 discloses an electric circuit board assembly line that includes multiple electrical component mounting machines which mount an electrical component on a circuit board. The electric circuit board assembly line is able to acquire information on another electrical component mounting machine (slave device) on a display of an arbitrary electrical component mounting machine (master device) that is designated by an operator.

CITATION LIST

Patent Literature

PTL 1: Japanese Patent No. 5186055

SUMMARY

Note that, in a case where an error has occurred in a board work device, for example, a power source of the board work device may be switched off with the object of coping with an error. Then, when the power source is switched off, in many cases it is not possible to display information which relates to an error on a display panel or the like of the own device. Thereby, an operator may not be able to know the information which relates to the error. PTL 1 describes acquiring information on a slave device on a display of a master device, but does not describe a case of switching off the power source of the slave device.

The disclosure is carried out in order to solve such a problem, and a main object is to notify information which relates to an error to an operator in a case where a power source of a board work device, in which the error has occurred, is switched off.

The disclosure has adopted the following device to achieve the main object described above.

A first board work device of the disclosure is a board work device used in a board work system which is provided with multiple board work devices that perform work on a board, the board work device including: an error information reception device which receives error related information which relates to an error of another board work device within the board work system; a storage device which stores the received error related information; a notification device which is able to notify information to an operator; and a notification control device which controls the notification device such that information is notified to the operator based on the error related information that is stored in the storage device in a case where a power source of the other board work device is detected to be switched off.

The first board work device receives error related information which relates to an error of the other board work device, and stores the received error related information in the storage device. Then, the notification device is controlled such that information is notified to the operator based on the stored error related information in a case where a power source of the board work device (other board work device) is detected to be switched off. Thereby, it is possible for the first board work device of the disclosure to notify information which relates to the error to the operator in a case where the power source of the other board work device, in which the error has occurred, is switched off. Here, the error information reception device may acquire the error related information from the other board work device, and for example, may acquire the error related information from another device (device other than the other board work device) such as a management device.

In the first board work device of the disclosure, the notification control device may detect that the power source of the other board work device is switched off based on a communication state with the other board work device. By doing so, it is possible to appropriately detect that the power source of the other board work device is switched off based on the communication state. In this case, the notification control device may detect that the power source of the other board work device is switched off when communication with the other board work device is cut off.

In the first board work device of the disclosure, the notification control device may detect that the power source of the other board work device is switched off based on whether or not a trigger signal is received. By doing so, it is possible to appropriately detect that the power source of the other board work device is switched off based on whether or not the trigger signal is received. Here, the notification control device may acquire the trigger signal from the other board work device, and for example, may acquire the trigger signal from another device (device other than the other board work device) such as a management device.

A second board work device of the disclosure is a board work device that is used in a board work system which is provided with multiple board work devices that perform work on the board, the board work device including error information transmission device for transmitting error related information which relates to an error in a case where the error has occurred in the own device, and a trigger signal transmission device which transmits a trigger signal when the power source of the own device is switched off.

The second board work device transmits the error related information which relates to the error in a case where the error has occurred in the own device. Then, the trigger signal is transmitted when the power source of the own device is switched off. Thereby, the error related information of the own device is able to be stored by the other board work device, and it is possible for the other board work device to detect that the power source of the own device is switched off by transmitting the trigger signal. Therefore, it is possible for the other board work device to notify information which relates to the error to the operator in a case where the power source of the board work device (the second board work device of the disclosure), in which the error has occurred, is switched off. Here, the error information transmission device may transmit the error related information to the other board work device, and for example, may transmit the error related information to another device such as a management device. In addition, the trigger signal transmission device may transmit the trigger signal to the other board work device, and for example, may transmit the trigger signal to another device such as the management device.

The second board work device of the disclosure may be provided with a conveyance device which conveys the board in the conveyance direction and a module that is able to be pulled out in a direction perpendicular to the conveyance direction. Here, "provided with a module that is able to be pulled out" includes a case of the entirety of the board work device being a module that is able to be pulled out.

A first board work system of the disclosure includes: a board work device which is provided with an error information transmission device which transmits error related information which relates to an error in a case where the error has occurred in the own device; and another board work device which is provided with an error information reception device which receives the error related information that relates to the error of the board work device, a storage device which stores the received error related information, a notification device which is able to notify information to an operator, and a notification control device which controls the notification device such that information is notified to the operator based on the error related information that is stored in the storage device in a case where a power source of the board work device is detected to be switched off based on a communication state with the board work device.

The first board work system is provided with the board work device and the other board work device. The board work device transmits the error related information which relates to the error in a case where the error has occurred in the own device. The other board work device is the same device as the first board work device of the disclosure in an aspect in which it is detected that the power source of the board work device is switched off based on the communication state. Therefore, in the first board work system of the disclosure, the same effects are obtained as the first board work device of the disclosure described above. In detail, it is possible for the other board work device to detect that the power source is switched off based on the communication state, and the other board work device is able to notify information which relates to the error to the operator in a case where the power source of the board work device, in which the error has occurred, is switched off.

A second board work system of the disclosure includes: a board work device which is provided with an error information transmission device which transmits error related information which relates to an error in a case where the error has occurred in the own device and a trigger signal transmission device which transmits a trigger signal when the power source of the own device is switched off; and another board work device which is provided with an error information reception device which receives the error related information which relates to the error of the board work device, a storage device which stores the received error related information, a notification device which is able to notify information to an operator, and a notification control device which controls the notification device such that information is notified to the operator based on the error related information that is stored in the storage device in a case where a power source of the board work device is detected to be switched off based on whether or not the trigger signal is received from the board work device.

The second board work system is provided with the board work device and the other board work device. The board work device is the same device as the second board work device of the disclosure. The other board work device is the same device as the first board work device of the disclosure in an aspect in which it is detected that the power source of the board work device is switched off based on whether or not the trigger signal is received. Therefore, the same effects are obtained as the first and second board work devices of the disclosure described above. In detail, it is possible for the other board work device to detect that the power source is switched off based on the trigger signal, and the other board work device is able to notify information which relates to the error to the operator in a case where the power source of the board work device, in which the error has occurred, is switched off.

A third board work system of the disclosure includes: a board work device which is provided with an error information transmission device which transmits error related information which relates to an error in a case where the error has occurred in the own device; another board work device which is provided with an error information reception device which receives the error related information that relates to the error of the board work device, a storage device which stores the received error related information, a notification device which is able to notify information to an operator, and a notification control device which controls the notification device such that information is notified to the operator based on the error related information that is stored in the storage device in a case where a power source of the board work device is detected to be switched off based on whether or not a trigger signal is received; and a management device that has a detection device which transmits the trigger signal to the other board work device in a case where the power source of the board work device is detected to be switched off based on the communication state with the board work device.

The third board work system is provided with the board work device, the other board work device, and the management device. The board work device transmits the error related information which relates to the error in a case where the error has occurred in the own device. The other board work device is the same device as the first board work device of the disclosure in an aspect in which it is detected that the power source of the board work device is switched off based on whether or not the trigger signal is received. Therefore, the same effects are obtained as the first board work device of the disclosure described above. In detail, it is possible for the other board work device to detect that the power source is switched off based on the trigger signal, and the other board work device is able to notify information which relates to the error to the operator in a case where the power source of the board work device, in which the error has occurred, is switched off. In addition, the management device transmits the trigger signal to the other board work device in a case where the power source of the board work device is detected to be switched off based on the communication state with the board work device. Therefore, even in a case where the board work device does not transmit the trigger signal, the other board work device is able to receive the trigger signal from the management device and detect that the power source is switched off.

In the first to third board work systems of the disclosure, the board work device and the other board work device may be disposed adjacent to each other. By doing so, in the board work device, an operator close to the board work device such as an operator who performs work which relates to an error more easily acquires information which relates to the error.

In the first to third board work systems of the disclosure, the board work device may have a module that is able to be pulled out in a direction perpendicular to an alignment direction of the other board work device. Here, "having a module that is able to be pulled out" includes a case of the entirety of the board work device being a module that is able to be pulled out.

The first to third board work systems of the disclosure may be provided with the management device that has an error information transmission and reception device which transmits the error related information to the other board work device by receiving the error related information from the board work device. By doing so, even in a case where, for example, it is not possible for the board work device and the other board work device to directly transmit and receive the error related information, it is possible to transmit and receive the error related information via the management device.

Note that, in the first to third board work systems of the disclosure, the error related information that is transmitted by the board work device and the error related information that is received by the other board work device may be the same or at least partially different. In a case where, for example, the board work device and the other board work device transmit and receive the error related information via the management device, the management device may differentiate a part of the received error related information and transmit to the other board work device. In addition, the management device may differentiate all of the received error related information (including a case where error related information is newly created) and transmit to the other board work device.

DESCRIPTION OF EMBODIMENTS

Figure 1:
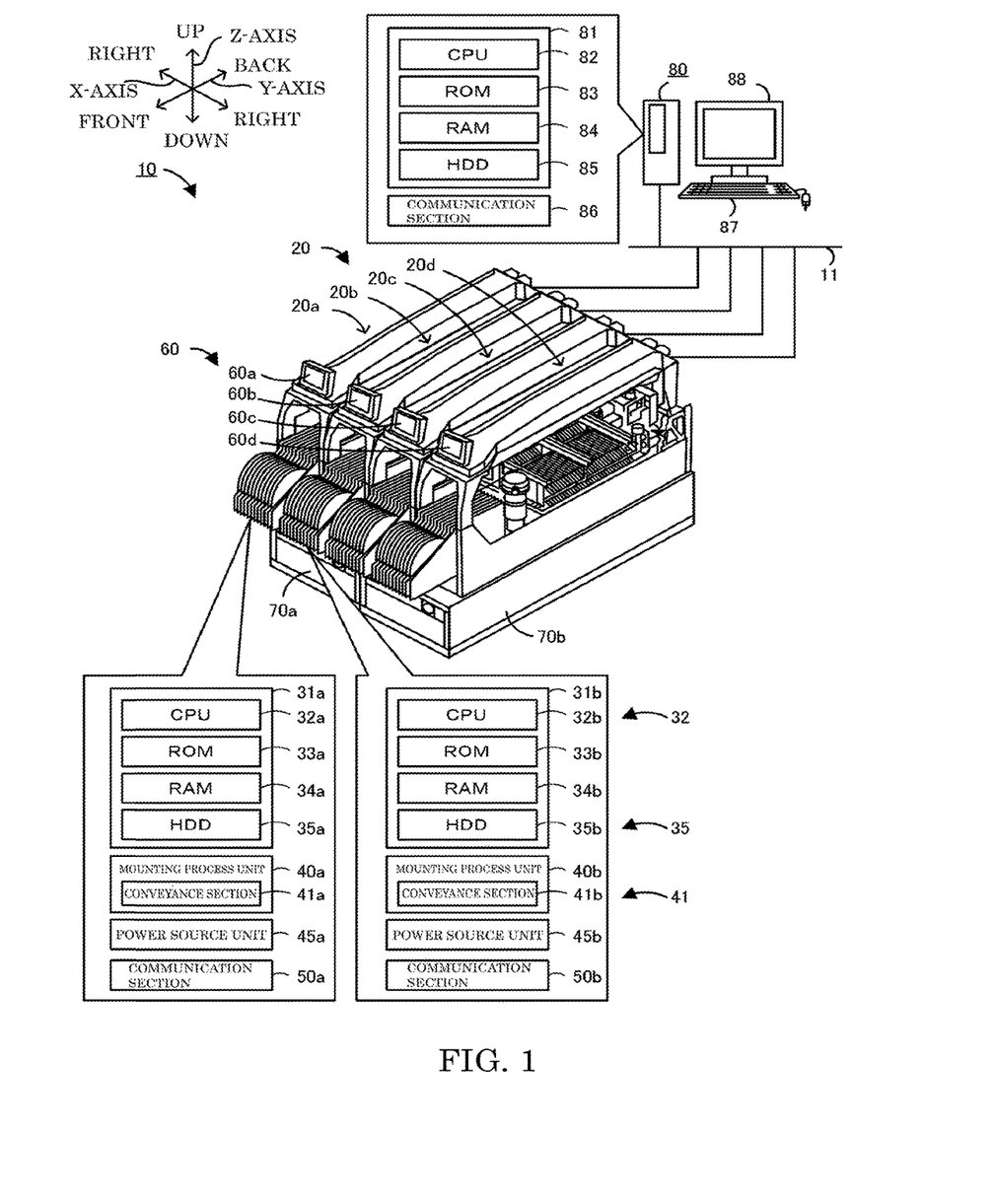
FIG. 1 is a schematic explanatory diagram of a board work system 10 of the present embodiment.

Embodiments of the disclosure are described below with reference to the drawings. FIG. 1 is a schematic explanatory diagram of a board work system 10. The board work system 10 of the present embodiment is provided with multiple board work devices 20 that perform work on a board, bases 70a and 70b which are stands that support the board work devices 20, and a management device 80 that manages or sets information on the board work devices. Note that, in the present embodiment, a left-right direction (X-axis), a front-back direction (Y-axis), and an up-down direction (Z-axis) are as indicated in FIG. 1.

The board work system 10 is provided with four board work devices 20a to 20d as the multiple board work devices 20. The four board work devices 20a to 20d constitute a mounting line lined up adjacent from left to right in order. In addition, the multiple board work devices 20 and the management computer 80 are connected to each other via a LAN 11.

The board work device 20a is a device that is constituted as a mounting device that performs a mounting process of a component on the board as the substrate work. Note that, the mounting process includes processes for placing, disposing, mounting, inserting, joining, adhering, and the like the component on the board. As shown in FIG. 1, the board work device 20a is provided with a control device 31a that controls the entirety of the device, a mounting process unit 40a that executes the mounting process, a power source unit 45a that powers each device, a communication section 50a that performs bidirectional communication with an external device that is connected to the LAN 11, and a display operation section 60a that displays or inputs information. The control device 31a is configured as a microprocessor where a CPU 32a is set as the center, and is provided with a ROM 33a which stores a process program, a RAM 34a which is used as a work region, an HDD 35a which stores various data, and the like. In addition, the control device 31a is provided with an input and output interface not shown, and is connected to be capable of bidirectional communication with the mounting process unit 40a, the power source unit 45a, and the communication section 50a. The mounting process unit 40a has a conveyance section 41a that conveys the board in a conveyance direction (left-right direction), a head that collects a component, and the like. The display operation section 60a is provided with a touch panel, an input key, and the like, and displays various information to an operator or inputs various instructions from the operator. The display operation section 60a is disposed at an upper portion in front of the board work device 20a.

Since the board work devices 20b to 20d are each the same device as the board work device 20a, detailed description is omitted. Note that, as shown in FIG. 1, each constituent element of the board work device 20b is represented by a reference numeral in which the end of each configuration element of the board work device 20a is changed from "a" to "b". In addition, display operation sections that are provided with the board work devices 20c and 20d are represented by reference numerals 60c and 60d. In a case where the display operation sections 60a to 60d are not particularly distinguished, the display operation section 60 is represented. In the same manner, in a case where a CPU that is provided with each of the board work devices 20a to 20d is not particularly distinguished, the CPU 32 is represented. In a case where an HDD that is provided with each of the board work devices 20a to 20d is not particularly distinguished, HDD 35 is represented.

Note that, the board work devices 20a and 20b are mounted on the base 70a, and are configured as a module that is able to be pulled out from the base 70a to the front (direction perpendicular to the left-right direction). In the same manner, the board work devices 20c and 20d are mounted on the base 70b, and are configured as a module that is able to be pulled out from the base 70b to the front.

Figure 2A:
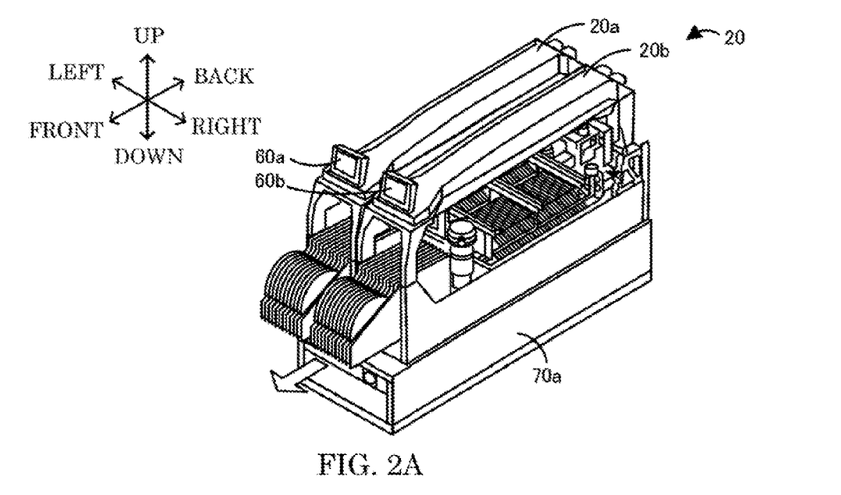
FIGS. 2A and 2B include explanatory diagrams illustrating a circumstance in which a board work device 20b is pulled out.
Figure 2B:
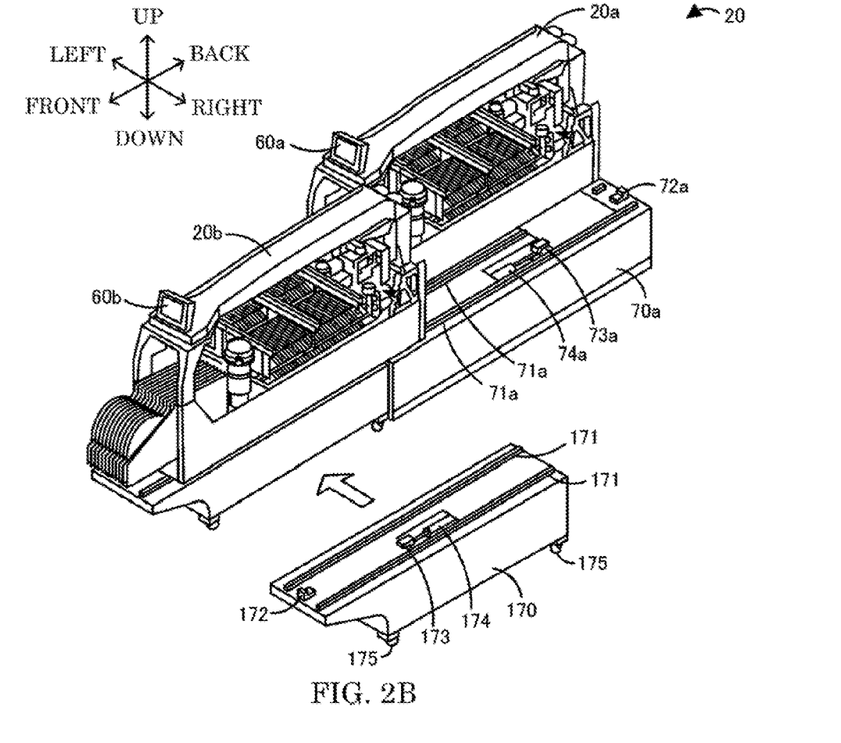

FIGS. 2A and 2B include explanatory diagrams illustrating a circumstance in which the board work device 20b is pulled out. FIG. 2A indicates a circumstance prior to the board work device 20b being pulled out, and FIG. 2B indicates a circumstance after the board work device 20b is pulled out. As shown in FIG. 2B, the base 70a is provided with a pair of guide rails 71a and 71a left and right extending in a front-back direction and a stopper 72a that is disposed on a rear end upper face of the base 70a and on which a rear end of the board work device 20b is fixed. In addition, the base 70a is provided with a lever 73a that regulates movement of the board work device 20b in the front-back direction, and a lever driving device 74a that switches whether or not the lever 73a protrudes upward. The board work device 20b is provided with wheels, which are not shown, on a lower face, and is able to slide in the front-back direction by the wheels being guided on the guide rails 71a and 71a. For example, the lever driving device 74a is provided with an air cylinder and the like that generates driving force in the front-back direction. The lever driving device 74a switches between a state in which the lever 73a is protruded upward and a state in which the lever 73a is brought down along the front-back direction by rotating (revolving shaft is the X-axis) the lever 73a in response to the driving force. While the board work device 20b is mounted at a fixed position (position in FIG. 2A) on the base 70a, the board work device 20b is fixed so as not to move forward and back by the lever 73a protruding upward. In addition, in a state in which the operator operates the lever driving device 74a and brings down the lever 73a, the board work device 20b is movable along the guide rails 71a and 71a, and the operator is able to pull out the board work device 20b forward (FIG. 2B). Note that, as shown in FIG. 2B, when the board work device 20b is pulled out, a moving table 170 that supports the pulled out board work device 20b from below is disposed in front of the base 70a in advance, and the pulled out board work device 20b is mounted on the movable carriage 170. The moving table 170 is provided with guide rails 171 and 171, a stopper 172, a lever 173, and a lever driving device 174. Since the constituent elements are the same as the base 70a, detailed description is omitted. In addition, the moving table 170 is configured to be movable on the floor by multiple wheels 175 being attached to the bottom.

Note that, although illustration is omitted, in the base 70a, a part on which the board work device 20a is mounted is provided with the same constituent elements as the guide rail 71a, the stopper 72a, the lever 73a, and the lever driving device 74a. Therefore, the board work device 20a is able to be pulled out in the same manner as the board work device 20b. Since the base 70b is constituted the same as the base 70a apart from the board work devices 20c and 20d being supported to be able to be pulled out, detailed description is omitted. In addition, the configuration of the board work device 20 that is able to be pulled out or the base 70 are publicly known, and are described, for example, in Japanese Patent No. 4763518.

The management device 80 is a computer that manages information relating to board work. The management device 80 is provided with a controller 81 that controls the entire device that is provided with a CPU 82, a ROM 83, a RAM 84, and an HDD 85, and a communication section 86 that communicates in both directions with an external device that is connected to the LAN 11. In addition, the management device 80 is provided with an input device 87 such as a keyboard and a mouse for inputting various instructions from the operator, and a display 88 that displays the various information. Production job data is stored in the HDD 85. Information such as which order and what component is mounted on the board of what board type in each board work device 20 and the number of mounted boards that are produced is included in the production job data.

In the board work system 10 configured in this manner, when the management device 80 inputs a start instruction from the operator, the management device 80 transmits the production job data to each board work device 20, and instructs the start of the mounting process to each board work device 20. Each board work device 20 that receives the start instruction from the management device 80 performs the mounting process of the component on the board that is conveyed from the conveyance direction upstream side (left side) based on the production job data, and conveys the board on which the mounting process is complete to the downstream side (right side). Thereby, the mounting process is performed in order by the board work devices 20a to 20d on the board that is conveyed from the upstream side of the board work system 10, and after that, the board is discharged from the board work device 20d.

Figure 3:
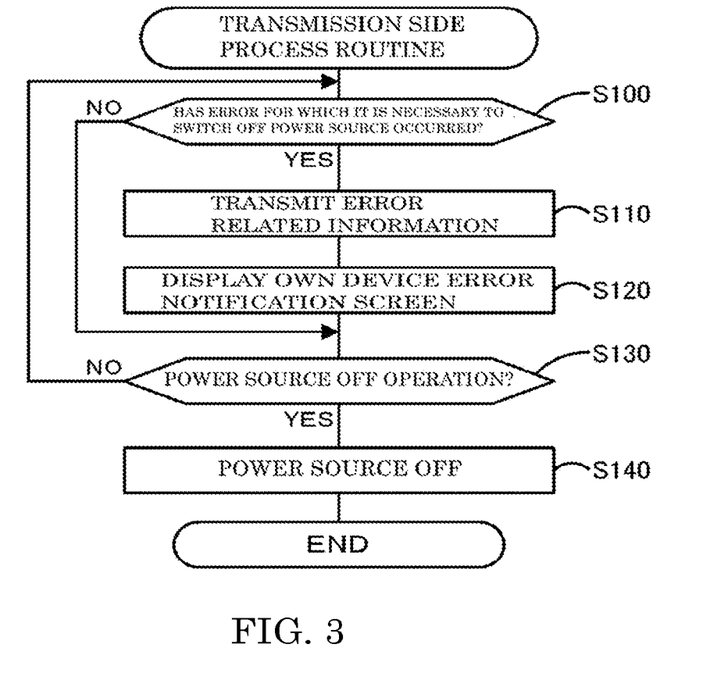
FIG. 3 is a flowchart illustrating an example of a transmission side process routine.

Next, an operation of case where an error is generated, for which it is necessary to switch off the power source, in any of the board work devices 20 out of the operations of the board work system 10, and information which relates to the error is displayed by another board work device 20 is described. For example, a case where the error is generated in the board work device 20b will be described below. FIG. 3 is a flowchart illustrating an example of a transmission side process routine which is executed by the CPU 32b of the control device 31b of the board work device 20b. The routine is stored in the HDD 35b of the control device 31b, and is executed when the power source of the board work device 20b is switched on.

When the routine is executed, first, the CPU 32b of the control device 31b determines whether or not the error has occurred, for which it is necessary to switch off the power source, in the own device (board work device 20b) (step S100). The CPU 32b performs determination according to whether or not a signal is received indicating that the error has occurred, for which it is necessary to switch off the power source, for example, from the mounting process unit 40b, the power source unit 45b, and the communication section 50b. The error for which it is necessary to switch off the power source is the error for which it is necessary to switch off the power source of the board work device 20 to cope with the error. The error for which it is necessary to switch off the power source is not particularly limited, but for examples includes a blown fuse and the like. In step S100, when the error for which it is necessary to switch off the power source has occurred, the CPU 32b transmits the error related information which relates to the error of the board work device 20b to the management device 80 (step S110). In the process, the CPU 32b transmits error related information to the management device 80 by creating the error related information in association with device identification information for identifying the own device and content of the error (for example, classification of the error such as a blown fuse). Note that, the CPU 32b may control the mounting process unit 40b such that the mounting process stops in a case where the board work device 20b is in the mounting process. Subsequently, the CPU 32b controls a display operation section 60b to display an own device error notification screen that notifies the operator of occurrence of error in the own device and the content of the error (step S120). Thereby, the own device error notification screen is displayed in the display operation section 60b, and information on the error is notified to the operator. The own device error notification screen may include a message or an image that prompts the operator to switch off the power source of the board work device 20b. The operator who confirms the own device error notification screen starts work for coping with the error (for example, switching off of the power source of the board work device 20b, replacement of the fuse thereafter, and the like).

In step S100, when the error for which it is necessary to switch off the power source has not occurred, or after step S120, the CPU 32b determines whether or not the power source switching off operation is input from the operator by the display operation section 60b (step S130), and when the power source switching off operation is not input, the processes following step S100 are executed. That is, the CPU 32b repeats a process in which transmission of the error related information or display of the own device error notification screen are performed when the error for which it is necessary to switch off the power source has occurred until the power source switching off operation is executed. Then, in step S130, when the power source switching off operation is input, the CPU 32b transmits a control signal to the power source unit 45b such that power supply to the board work device 20b stops (step S140), and the routine ends. Thereby, the power source of the board work device 20b is switched off, and there is a state in which the own device error notification screen and the like of the display operation section 60b are not displayed. In addition, communication of the board work device 20b and another device is cut off.

Figure 4:
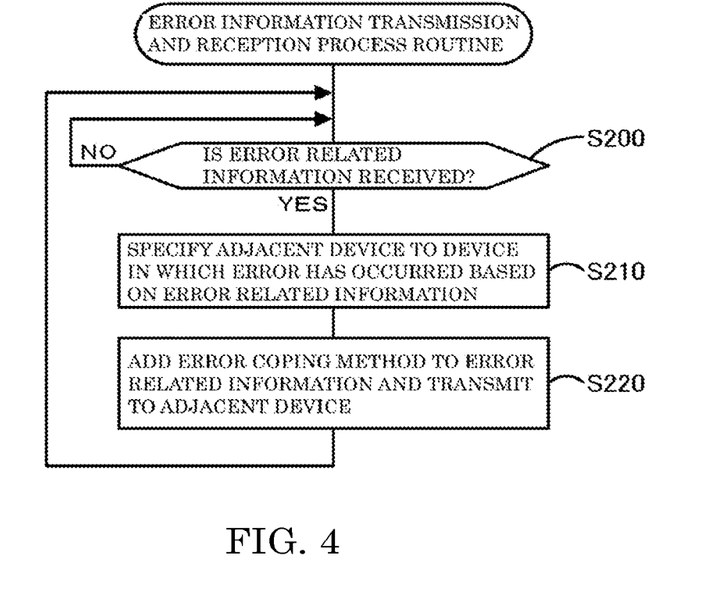
FIG. 4 is a flowchart illustrating an example of an error information transmission and reception process routine.

Next, in the board work device 20, the operation of the management device 80 which relates to occurrence of the error will be described. FIG. 4 is a flowchart illustrating an example of an error information transmission and reception process routine which is executed by the CPU 82 of the control device 81 of the management device 80. The routine is stored in the HDD 85 of the control device 81, and is executed when the power source of the management device 80 is switched on.

When the routine is executed, first, the CPU 82 of the control device 81 determines whether or not the error related information described above is received from any of the board work devices 20a to 20d is received via the LAN 11 (step S200), and waits when the information is not received until the information is received. When the error related information is received, the CPU 82 specifies the board work device 20 which is adjacent to the device board work device 20 in which the error has occurred based on the device identification information that is included in the received error related information (step S210). Here, device arrangement information, such as a table and the like in which, for example, device identification information and a position on a mounting line of the board work device 20 that is represented in the device identification information are associated, is stored in advance in the HDD 85. Then, the CPU 82 specifies an adjacent device based on the device arrangement information. The CPU 82 specifies the board work devices 20a and 20c that are adjacent to the board work device 20b as the adjacent devices when, for example, the error related information is received from the board work device 20b. Subsequently, the CPU 82 adds an error coping method to the received error related information, and in step S210, transmits the information to the specified adjacent device (step S220). Here, error coping information, such as a table or the like in which error content and the coping method of the error are associated, is stored in advance in the HDD 85. For example, the error coping information is information that indicates a position of a fuse in the board work device 20, a procedure of replacement work, or the like in a case where the error content is a blown fuse. Then, the CPU 82 derives the coping method corresponding to the error content that is included in the received error related information based on error coping information, adds the derived error coping method to the error related information and transmits to the adjacent device. When the process in step S220 is performed, the CPU 82 performs the processes after step S200. Thereby, the CPU 82 repeats the process in which the error related information is transmitted to the adjacent device when the error related information is received.

Figure 5:
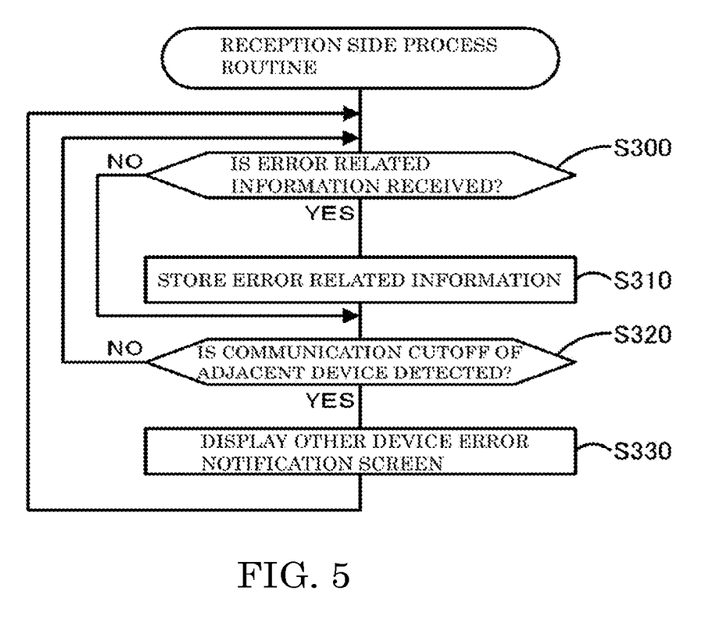
FIG. 5 is a flowchart illustrating an example of a reception side process routine.

Subsequently, an operation of the other board work device 20 (another board work device 20 to the board work device 20 in which the error for which it is necessary to switch off the power source has occurred) will be described. Hereinafter, for example, an operation of the board work device 20a that is adjacent to the board work device 20b in which an error has occurred will be described. FIG. 5 is a flowchart illustrating an example of a reception side process routine which is executed by the CPU 32a of the control device 31a of the board work device 20a. The routine is stored in the HDD 35a of the control device 31a, and is executed when the power source of the board work device 20b is switched on.

When the routine is executed, first, the CPU 32a of the board work device 20a determines whether or not the error related information described above is received from the management device 80 via the LAN 11 (step S300). When the error related information is received, the CPU 32a stores the received error related information in the HDD 35a (step S310). In step S300, when the error related information is not received, or after step S310, the CPU 32a determines whether or not cut off of communication with the adjacent board work device 20 is detected (step S320). For example, the CPU 32a transmits the signal that confirms whether or not it is possible to communicate with the adjacent device (here, the board work device 20b), and detects that the communication is cut off when there is no reply from the board work device 20b for a fixed time. Alternatively, each board work device 20 regularly transmits a beacon to the other device, and the CPU 32 may detect that communication is cut off when the beacon is not received from the adjacent device. In step S320, when communication is not cut off, the CPU 32a executes the processes after step S300, and repeats reception and storage of the error information until it is detected that communication is cut off. In step S320, when the communication is detected to be cut off, the CPU 32a reads out the error related information of the adjacent device, in which it is detected that communication is cut off, from the HDD 35a, and an other device error notification screen is displayed on the display operation section 60a based on the error related information (step S330). In the process, CPU 32a investigates whether the error related information, which includes the device identification information of the adjacent device for which it is detected that communication is cut off, is stored in the HDD 35a, and when stored, the error related information is read out. That is, even if the error related information of the board work device 20 other than the board work device 20 for which it is detected that communication is cut off is stored in the HDD 35a, the CPU 32a does not read out the information since the error related information is not information to be displayed. Then, the CPU 32a controls the display operation section 60a to display the other device error notification screen which notifies the operator of the information on what error has occurred in which board work device 20 and the error coping method based on the device identification information, error content, and the error coping method which are included in the readout error related information. Thereby, the other device error notification screen is displayed in the display operation section 60a, and information on the error of the board work device 20b is notified to the operator. When the process in step S330 is performed, the CPU 32a executes the processes after step S300.

Figure 6:
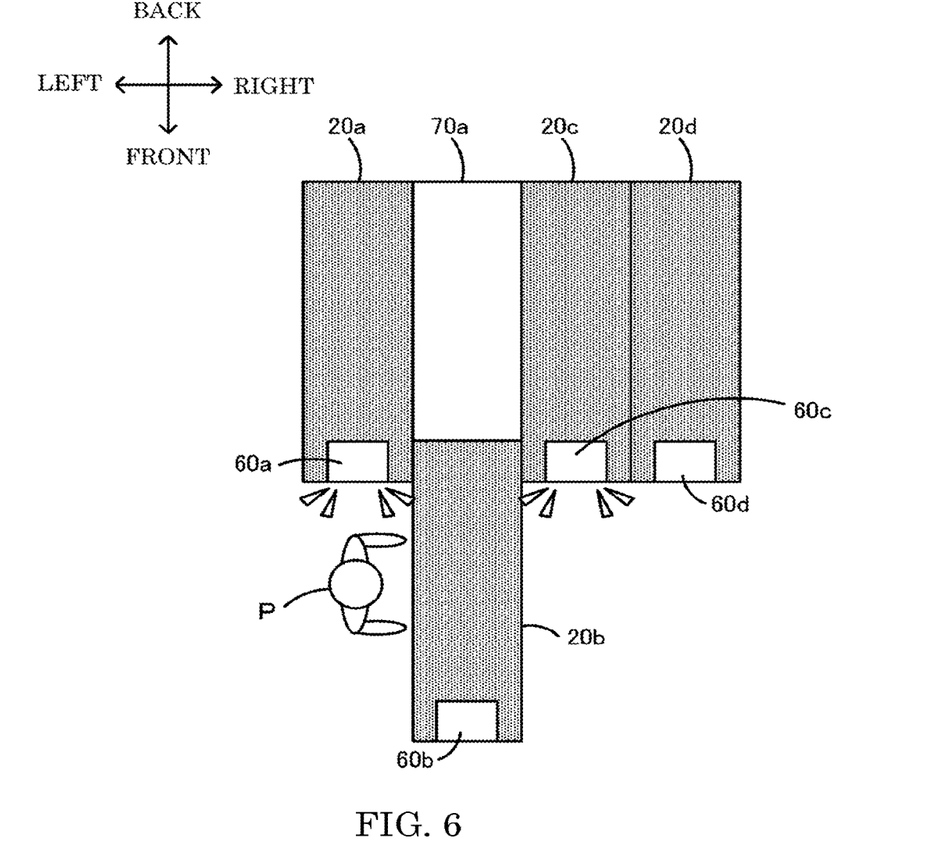
FIG. 6 is an explanatory diagram illustrating a circumstance in which an operator P copes with an error in the board work device 20b.

Here, in step S120 in FIG. 3, the operator who confirms the own device error notification screen that is displayed on the display operation section 60b of the board work device 20b performs work to cope with the error. In detail, first, the display operation section 60b is operated and the power source of the board work device 20b is switched off, and as shown in FIG. 2B, the board work device 20b is in a pulled out state. Then, the operator from the left and right of the board work device 20b performs work for coping with the error. FIG. 6 is an explanatory diagram viewing from above a circumstance in which an operator P copes with the error from the left side in the board work device 20b. As described above, the power source for the board work device 20b itself in which the error has occurred is switched off, and therefore the information which relates to the error is not displayed on the display operation section 60b. At this time, the CPU 32a of the board work device 20a detects that the power source is off by detecting that communication with the board work device 20b is cut off and the other device error notification screen is displayed on the display operation section 60a by performing the reception side process routine described above. Therefore, as shown in FIG. 6, it is possible for the operator P to confirm the other device error notification screen in the display operation section 60a on the left hand side (rear) himself/herself. Therefore, even after the power source of the board work device 20b is switched off, the operator P is able to confirm error content or the coping method of the board work device 20b using the display operation section 60a in place of the display operation section 60b, and it is possible to properly cope with the error.

Note that, the board work devices 20a to 20d as described above are all the same devices, and respectively execute either of the transmission side process routine in FIG. 3 and the reception side process routine in FIG. 5. For example, when the error for which it is necessary to switch off the power source has occurred in the board work device 20b, as described in step S220 in FIG. 4, the management device 80 transmits the respective error related information to the board work devices 20a and 20c that are adjacent devices. Therefore, even in the board work device 20c in the same manner as the board work device 20a, reception and storage of the error related information, and detection of communication cut off with the board work device 20b are performed by the reception side process routine, and in S330, the other device error notification screen is displayed on the display operation section 60c (refer to FIG. 6). Thereby, even in a case where the operator P operates from either of the left or right of the board work device 20b, content of the error or the coping method are easily confirmed.

In addition, description is made of when the error for which it is necessary to switch off the power source has occurred in the board work device 20b as an example described above, but when the error for which it is necessary to switch off the power source has occurred in any of the board work devices 20a, 20c, and 20d is the same. For example, when the error for which it is necessary to switch off the power source has occurred in the board work device 20c, and when the power source of the board work device 20c is switched off, the other device error notification screen is displayed by the display operation sections 60b and 60d of the board work devices 20b and 20d that are adjacent devices. Note that, in a case where the error for which it is necessary to switch off the power source has occurred in both of the board work devices 20b and 20d and both power sources are switched off, the display operation section 60c of the board work device 20c that is adjacent to the board work devices 20b and 20d may display the other device error notification screen that includes information based on the error related information of the board work device 20b and information based on the error related information of the board work device 20d.

The correspondence relationship between constituent elements of the present embodiment and configuration elements of the disclosure is clarified. The CPU 32 that executes step S300 in FIG. 5 of the present embodiment is equivalent to an error information reception device of the disclosure, the HDD 35 is equivalent to an error information storage device, the display operation section 60 is equivalent to a notification device, and the CPU 32 that executes steps S320 and S330 in FIG. 5 of the present embodiment is equivalent to a notification control device. In addition, the conveyance section 41 is equivalent to a conveyance device, the CPU 32 that executes steps S100 and S110 in FIG. 3 is equivalent to an error information transmission device of the disclosure, the board work device 20 is equivalent to a module that is able to be pulled out, and the CPU 82 that executes steps S200 to S220 in FIG. 4 is equivalent to an error information transmission and reception device.

In the board work system 10 described above, the CPU 32 of the board work device 20 transmits the error related information which relates to the error in a case where the error has occurred in the own device. Then, the CPU 32 receives the error related information which relates to the error of the other board work device 20, and stores the received error related information in the HDD 35. Then, the display operation section 60 is controlled such that information (other device error notification screen) based on the stored error related information is notified to the operator in a case where the power source of the board work device 20 (other board work device 20), in which the error has occurred, is detected to be switched off. Thereby, it is possible for the other board work device 20 to notify information which relates to the error to the operator in a case where the power source of the other board work device 20, in which the error has occurred, is switched off. Note that, in the present embodiment, when the power source of the other board work device 20, in which the error has occurred, is switched off, the other board work device 20 automatically displays the other device error notification screen. Therefore, it is not necessary for the operator to operate the other board work device 20 such that the other device error notification screen is displayed.

In addition, the CPU 32 of the board work device 20 detects that the power source of the board work device 20 is switched off based on the communication state with the other board work device 20, therefore it is possible to properly switch off the power source of the board work device 20 based on the communication state. In addition, the CPU 32 detects that the power source of the board work device 20 is switched off when the communication with the board work device 20 is cut off.

Furthermore, the board work device 20 in which the error has occurred and the board work device 20 for which the other device error notification screen is displayed are disposed adjacently. Therefore, the operator, close to the board work device 20 in which the error has occurred such as an operator who performs work that relates to the error in the board work device 20 in which the error has occurred, more easily acquires information which relates to the error. In addition, the board work device 20 is configured as a module that is able to be pulled out in an alignment direction (left-right direction) of the other board work device 20 or a direction (forward) orthogonal to the conveyance direction (left-right direction) of the board. In a case where the operator performs work from the alignment direction (left-right direction) of the board work device 20 with respect to the board work device 20 in the pulled out state, the operator relatively easily views the screen at a position at which the operator is able to confirm the display operation section 60 (for example, display operation section 60a in FIG. 6) of the adjacent board work device 20 from the front surface of the display operation section 60. Meanwhile, for example, in a case where the operator performs work from the front of the board work device 20 without pulling out the board work device 20, the operator confirms from an angle the display operation section 60 of the adjacent board work device 20. Therefore, in a case where the board work device 20 is able to be pulled out, it is worthwhile to display the other device error notification screen in the display operation section 60 of the adjacent device.

Furthermore, the CPU 82 of the management device 80 receives the error related information from the board work device 20 and transmits the error related information to the other board work device 20. Therefore, even in a case where, for example, it is not possible for the board work device 20 and the other board work device 20 to directly transmit and receive the error related information, it is possible to transmit and receive the error related information via the management device 80. In addition, since the CPU 82 adds the error coping method to the received error related information and transmits to the adjacent device, it is not necessary for the board work device 20 to store in advance the information which relates to the error coping method.

Note that, needless to say, the disclosure is not limited to the embodiments described above, and it is possible to execute various forms within the technical scope of the disclosure.

For example, in the embodiment described above, the CPU 32 detects whether or not communication with the adjacent board work device 20 is cut off, but is not particularly limited as long as the CPU 32 detects that the power source of the other board work device 20 is switched off based on the communication state with the other board work device 20. In addition, not limited to the communication state, whatever the method, the CPU 32 may detect that the other power source of the other board work device 20 is switched off. For example, the CPU 32 may detect that the power source of the other board work device 20 is switched off based on whether or not a predetermined trigger signal is received. For example, the CPU 32 of the board work device 20 in which the error has occurred may input an operation for switching off the power source in step S130 in FIG. 3, then execute step S140 after transmitting the trigger signal to the adjacent board work device 20. The CPU 32 that transmits the trigger signal in this case is equivalent to a trigger signal transmission device of the disclosure. Then, the CPU 32 of the other board work device 20 may determine whether or not the trigger signal is received in step S320 in FIG. 5, and execute step S330 when the trigger signal is received. By doing so, it is possible for the CPU 32 to appropriately detect that the power source of the other board work device 20 is switched off based on whether or not the trigger signal is received. Note that, in step S330, the CPU 32 may specify whether any of the error related information stored in the HDD 35 is read out based on the device identification information that is included in the trigger signal, and may determine and specify a transmission source of the trigger signal. Either of information that is able to identify that the power source of any board work device 20 is switched off (for example, the device identification information described above) and command information that displays information with respect to the board work device 20 that receives the trigger signal based on the error related information that is stored in the HDD 35 may be included in the trigger signal. Note that, in a case where the CPU 32 of the board work device 20 in which the error has occurred transmits the trigger signal, the CPU 32 may directly transmit to the adjacent board work devices 20, and may transmit to the management device 80. In the case of the latter, the CPU 82 of the management device 80 may transmit the trigger signal to the adjacent device. In addition, the board work device 20 in which the error has occurred may not transmit the trigger signal, and even in this case, the other board work device 20 may be able to receive the trigger signal. For example, the CPU 82 of the management device 80 may transmit the trigger signal to the board work device 20 that is adjacent to the board work device 20 in a case where the power source of the board work device 20 is detected to be switched off (for example, executes the same process as step S320) based on the communication state with the board work device 20. The CPU 82 that performs such a process is equivalent to a detection device of the third board work system of the disclosure.

In the embodiment described above, the CPU 82 of the management device 80 receives the error related information and adds the error coping method, then transmits to the adjacent device, but is not limited thereto. For example, the CPU 82 may transmit the received error related information without any changes to the adjacent device, delete a part of the received error related information, or transmit newly created error related information (for example, error related information only including the error coping method, and the like) to the adjacent device. In addition, the CPU 32 of the board work device 20 in which the error has occurred may transmit the error related information in step S110 to the directly adjacent board work device 20.

In the embodiment described above, the entirety of the board work device 20 is configured as a module that is able to be pulled out, but is not limited thereto, and a part of the board work device 20 may be a module that is able to be pulled out, and the board work device 20 may be a device that is not able to be pulled out.

In the embodiment described above, the board work device 20 in which the error has occurred and the board work device 20 for which the other device error notification screen is displayed when the power source of device is switched off may be adjacent, but are not limited thereto. For example, in step S220 in FIG. 4, the CPU 82 of the management device 80 transmits the error related information to only the adjacent device, but is not limited thereto, and may also transmit the error related information to the board work device 20 that is not the adjacent device. Even an alternative embodiment in which the trigger signal described above is transmitted is the same.

In the embodiment described above, the device identification information is included in the error related information, the CPU 82 specifies the adjacent device to the device in which the error has occurred based on the error related information, but is not limited thereto. For example, in a case where the power source of the board work device 20 in which the error has occurred is switched off, and in a case where the board work system 10 is configured to display only the other device error notification screen in the board work device 20 that is adjacent to one of the alignment direction (for example, left direction) of the board work device 20, it is possible to omit the device identification information. For example, in the board work device 20, in a case where only the error related information from the board work device 20 that is adjacent in the right direction of the own device is stored in each HDD 35 and the CPU 32 detects only that the power source of the board work device 20 that is adjacent in the right direction of the own device is switched off, it is not necessary to include the device identification information in the error related information.

In the embodiment described above, the CPU 82 of the management device 80 transmits the error related information to only the adjacent device, but is not limited thereto.

For example, the CPU 82 may transmit the error related information to all of the board work devices 20 other than the board work device 20 in which the error has occurred. In this case, the CPU 32 of the board work device 20 may not store the error related information in the HDD 35 in a case where the received error related information is not information which relates to the board work device 20 that is adjacent to the own device. In the same manner as in the alternative embodiment in which the trigger signal described above is transmitted, in a case where the received trigger signal is not a trigger signal which relates to the board work device 20 that is adjacent to the own device, the CPU 32 may not perform display of the other device error notification screen.

In the embodiment described above, the CPU 32 of the board work device 20 notifies the operator of the information based on the error related information by displaying the other device error notification screen on the display operation section 60, but is not limited thereto as long as the information is able to be notified to the operator. For example, the board work device 20 may notify the information to the operator based on the error related information by voice and the like. In addition, in the embodiment described above, the CPU 32 displays the error notification screen which includes the information on what error has occurred in which board work device 20 and the error coping method, but is not limited thereto, and may notify any information.

In the embodiment described above, the CPU 32 of the board work device 20 determines whether or not a power source switch off operation is input from the operator in step S130 in FIG. 3, but is not limited thereto. For example, when the error for which it is necessary to switch off the power source has occurred, the CPU 32 may automatically switch off the power source of the board work device 20 by executing step S140 without any changes after transmitting the error related information in step S110.

In the embodiment described above, the CPU 32 of the board work device 20 transmits the error related information when the error for which it is necessary to switch off the power source has occurred, but is not limited thereto. For example, the CPU 32 may transmit the error related information when the error not limited by whether or not it is necessary to switch off the power source has occurred In the embodiment described above, the board work device 20 is a mounting device that performs the mounting process of the component on the board, but is not limited thereto as long as the device performs work on the board. For example, the board work device 20 may be a coating device that performs coating of a viscous fluid (adhesive and the like) on the board or the component on the board, and may be a printing device that coats the viscous fluid and the like by screen printing on the board. In addition, all of the board work devices 20 that constitute the board work system 10 in the embodiment described above have the same mounting device, but are not limited thereto, and the board work system 10 may be provided with different types of board work devices.

In the embodiment described above, description is made of an operation of the board work devices 20 that constitute the board work system 10, but as long as the board work devices of the disclosure are used in the board work system 10, the board work devices 20 may be in individual states.

INDUSTRIAL APPLICABILITY

The disclosure is able to be used in a technical field of board work devices that perform work such as a mounting process on a board.

REFERENCE SIGNS LIST

10: BOARD WORK SYSTEM, 11: LAN, 20, 20a-20d: BOARD WORK DEVICE, 31a, 31b: CONTROL DEVICE, 32, 32a, 32b: CPU, 33a, 33b: ROM, 34a, 34b: RAM, 35, 35a, 35b: HDD, 40a, 40b: MOUNTING PROCESS UNIT, 41, 41a, 41b: CONVEYANCE SECTION, 45a, 45b: POWER SOURCE UNIT, 50a, 50b: COMMUNICATION SECTION, 60, 60a-60d: DISPLAY OPERATION SECTION, 70a, 70b: BASE, 71a: GUIDE RAIL, 72a: STOPPER, 73a: LEVER, 74a: LEVER DRIVING DEVICE, 80: MANAGEMENT DEVICE, 81: CONTROL DEVICE, 82: CPU, 83: ROM, 84: RAM, 85: HDD, 86: COMMUNICATOR, 87: INPUT DEVICE, 88: DISPLAY, 170: MOVING TABLE, 171: GUIDE RAIL, 172: STOPPER, 173: LEVER, 174: LEVER DRIVING DEVICE, 175: WHEEL, P: OPERATOR

The invention claimed is:

1. A board work device used in a board work system which is provided with first and second board work devices that perform work on a board, the board work device comprising:
   circuitry configured to
      receive error related information which relates to an error of the first board work device within the board work system;
      store the received error related information; and
      notify information to an operator
      such that information is notified to the operator on a display of the second board work device based on the error related information of the first board work device that is stored in a case where a power source of the first board work device is detected to be switched off.

2. The board work device according to claim 1, wherein the circuitry is configured to detect that the power source of the first board work device is switched off based on a communication state with the first board work device.

3. The board work device according to claim 1, wherein the circuitry is configured to detect that the power source of the first board work device is switched off based on whether or not a trigger signal is received.

4. A board work device used in a board work system which is provided with first and second board work devices that perform work on a board, the board work device comprising:
   circuitry configured to
      transmit error related information which relates to an error in a case where the error has occurred in the first board work device; and
      transmit a trigger signal to the second board work device when a power source of the first board work device is switched off.

5. The board work device according to claim 4, further comprising:
   a conveyance section which conveys the board in a conveyance direction; and
   a module that is able to be pulled out in a direction perpendicular to the conveyance direction.

6. A board work system comprising:
a first board work device provided with circuitry configured to transmit error related information which relates to an error in a case where the error has occurred in the first board work device; and
a second board work device which is provided with circuitry configured to:
receive the error related information from the first board work device which relates to the error of the first board work device,
store the received error related information, and
notify information to an operator such that information is notified to the operator on a display of the second board work device based on the error related information that is stored in a case where a power source of the first board work device is detected to be switched off based on a communication state with the first board work device.

7. A board work system comprising:
a first board work device which is provided with circuitry configured to:
transmit error related information which relates to an error in a case where the error has occurred in the first board work device, and
transmit a trigger signal when a power source of the first board work device is switched off; and
a second board work device which is provided with circuitry configured to:
receive the error related information from the first board work device which relates to the error of the first board work device,
store the received error related information, and
notify information to an operator such that information is notified to the operator on a display of the second board work device based on the error related information that is stored in a case where the power source of the first board work device is detected to be switched off based on whether or not the trigger signal is received from the first board work device.

8. A board work system, comprising:
a first board work device which is provided with circuitry configured to transmit error related information which relates to an error in a case where the error has occurred in the first board work device;
a second board work device which is provided with circuitry configured to:
receive the error related information from the first board work device that relates to the error of the first board work device,
store the received error related information, and
notify information to an operator such that information is notified to the operator on a display of the second board work device based on the error related information that is stored in a case where a power source of the first board work device is detected to be switched off based on whether or not a trigger signal is received; and
a management device that transmits the trigger signal to the second board work device in a case where the power source of the first board work device is detected to be switched off based on a communication state with the first board work device.

9. The board work system according to claim 6,
wherein the first board work device and the second board work device are disposed adjacent to each other.

10. The board work system according to claim 6,
wherein the first board work device has a module that is able to be pulled out in a direction perpendicular to an alignment direction of the second board work device.

11. The board work system according to claim 6, further comprising:
a management device that transmits the error related information to the second board work device by receiving the error related information from the first board work device.

12. The board work system according to claim 7,
wherein the first board work device and the second board work device are disposed adjacent to each other.

13. The board work system according to claim 7,
wherein the first board work device has a module that is able to be pulled out in a direction perpendicular to an alignment direction of the second board work device.

14. The board work system according to claim 8,
wherein the first board work device and the second board work device are disposed adjacent to each other.

15. The board work system according to claim 8,
wherein the first board work device has a module that is able to be pulled out in a direction perpendicular to an alignment direction of the second board work device.

* * * * *